(12) United States Patent
McGaughy et al.

(10) Patent No.: US 10,002,217 B2
(45) Date of Patent: Jun. 19, 2018

(54) REGION BASED DEVICE BYPASS IN CIRCUIT SIMULATION

(71) Applicant: PROPLUS ELECTRONICS CO., LTD., Jinan (CN)

(72) Inventors: Bruce W. McGaughy, Pleasanton, CA (US); Zhenzhong Zhang, Beijing (CN); Jun Fang, Beijing (CN); Xinjun Niu, Beijing (CN)

(73) Assignee: PROPLUS DESIGN SOLUTIONS, INC., San Jose, CA (US)

( * ) Notice: Subject to any disclaimer, the term of this patent is extended or adjusted under 35 U.S.C. 154(b) by 978 days.

(21) Appl. No.: 14/332,240

(22) Filed: Jul. 15, 2014

(65) Prior Publication Data

US 2015/0331982 A1 Nov. 19, 2015

(30) Foreign Application Priority Data

May 15, 2014 (CN) .......................... 2014 1 0204543

(51) Int. Cl.
*G06F 17/50* (2006.01)

(52) U.S. Cl.
CPC ...... *G06F 17/5045* (2013.01); *G06F 17/5036* (2013.01)

(58) Field of Classification Search
None
See application file for complete search history.

(56) References Cited

U.S. PATENT DOCUMENTS

| 8,195,439 | B1 * | 6/2012 | Hussain | G06F 17/5036 703/14 |
| 2007/0157133 | A1 * | 7/2007 | Cheng | G06F 17/5036 716/115 |
| 2008/0133202 | A1 * | 6/2008 | Tseng | G06F 17/5036 703/14 |
| 2010/0169848 | A1 * | 7/2010 | Nahmanny | G06F 17/5063 716/103 |
| 2014/0129202 | A1 * | 5/2014 | Sadigh | G06F 17/5072 703/14 |

* cited by examiner

*Primary Examiner* — Cedric Johnson
(74) *Attorney, Agent, or Firm* — Silicon Valley Patent Group LLP

(57) ABSTRACT

Methods and systems are disclosed related to region based device bypass in circuit simulation. In one embodiment, a computer implemented method of performing region based device bypass in circuit simulation includes receiving a subcircuit for simulation, where the subcircuit includes a plurality of devices, and determining node tolerance of the plurality of devices. The computer implemented method further comprises for each device in the plurality of devices, determining whether the device has entered into a bypass region using the node tolerance of the plurality of devices, performing model evaluation in response to the device has not entered the bypass region, and skipping model evaluation in response to the device has entered the bypass region.

22 Claims, 8 Drawing Sheets

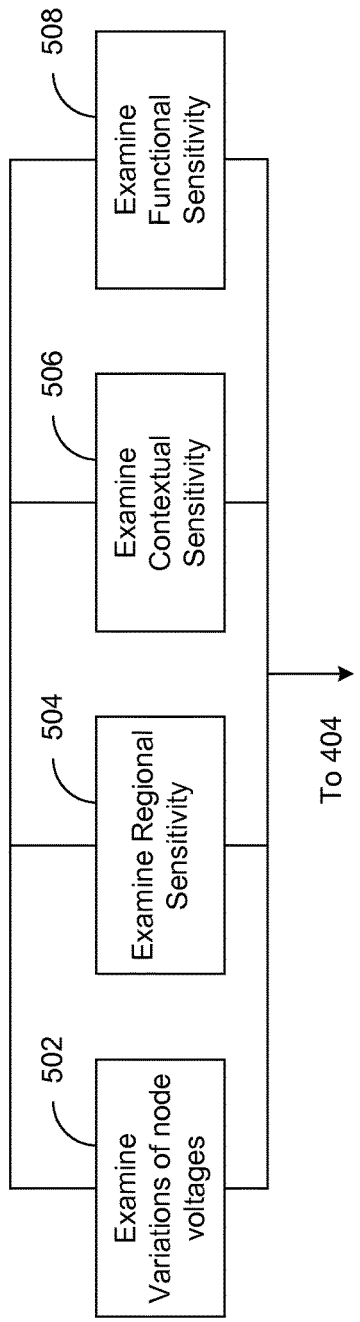
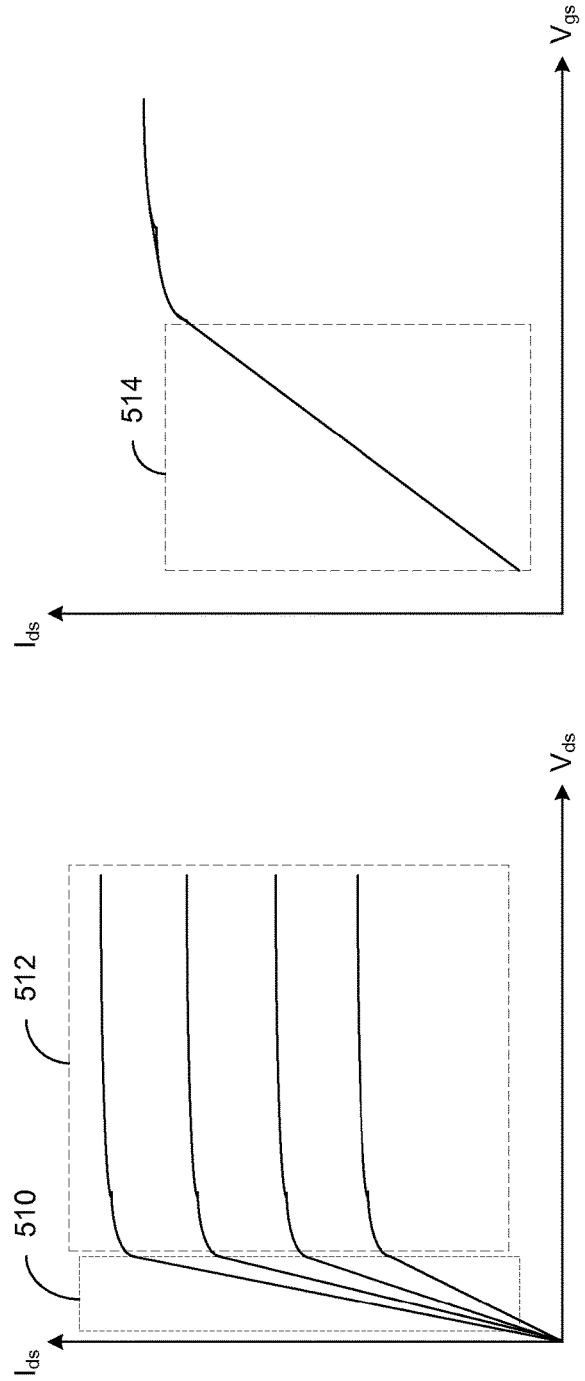
Figure 5A
Figure 5B
Figure 5C

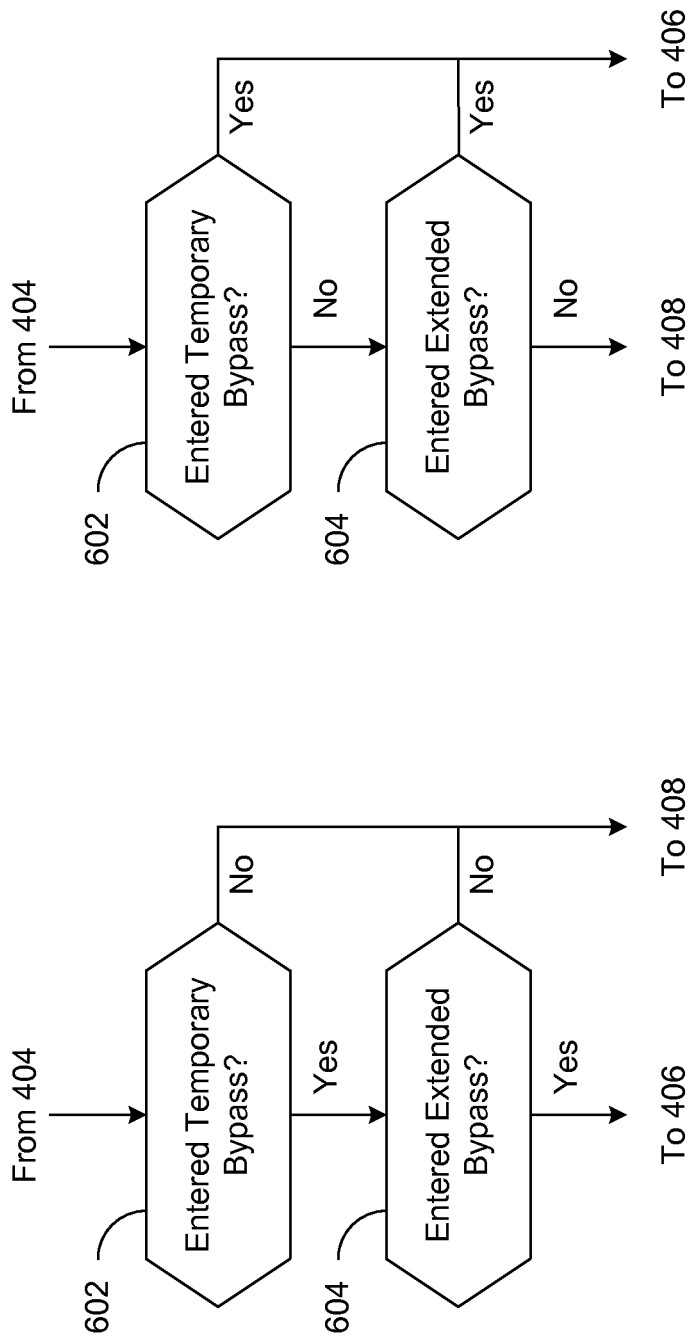

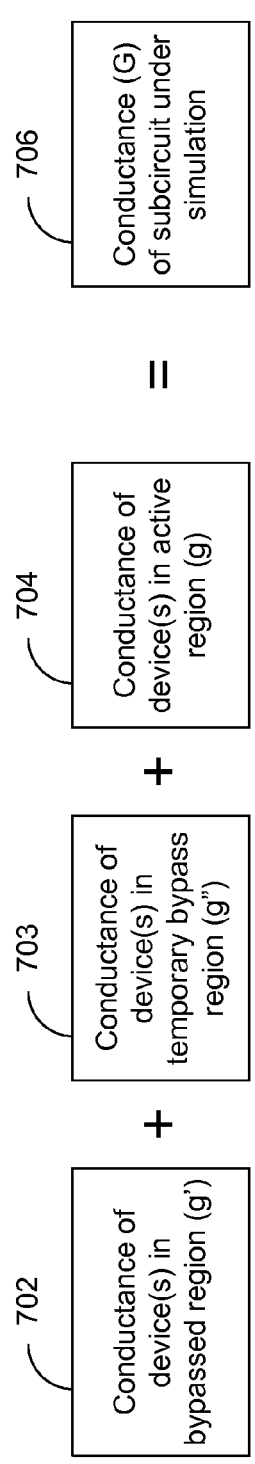
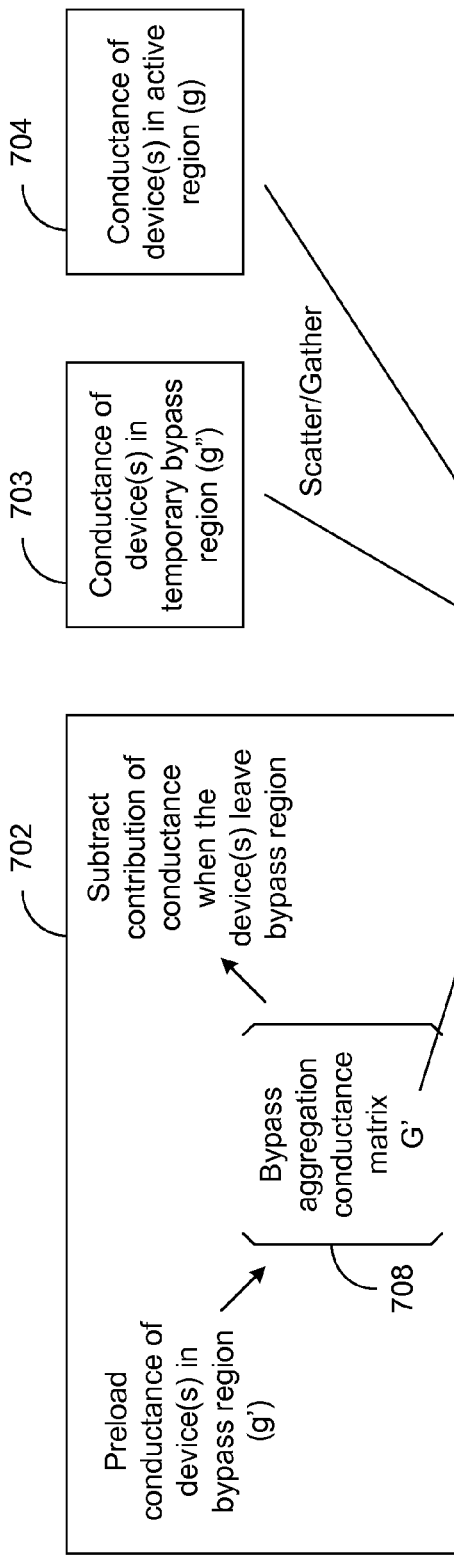

REGION BASED DEVICE BYPASS IN CIRCUIT SIMULATION

CROSS-REFERENCE TO PRIORITY APPLICATION FILED IN CHINA

This patent application claims priority from Chinese Application No. 201410204543.5 filed in The State Intellectual Property Office of the People's Republic of China on May 15, 2014, which is incorporated by reference herein in its entirety.

FIELD

The present invention relates to the field of electronic design automation tools. In particular, the present invention relates to region based device bypass in circuit simulation.

BACKGROUND

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc.

The development of complicated integrated circuits often requires the use of powerful numerical simulation programs. For example, circuit simulation is an essential part in the design flow of integrated circuits, helping circuit designers to verify the functionality and performance of their designs without going through expensive fabrication processes. As the semiconductor processing technology migrates to nanometer dimensions, new simulation methodologies are needed to solve the new problems intrinsically existing in circuit design with nanometer features. Modern integrated circuits continually challenge circuit simulation algorithms and implementations in the development of new technology generations. The semiconductor industry requires EDA software with the ability to analyze nanometer effects like coupling noise, ground bounce, transmission line wave propagation, dynamic leakage current, supply voltage drop, and nonlinear device and circuit behavior, which are all related to dynamic current. Thus, detailed circuit simulation and transistor-level simulation have become one of the most effective ways to investigate and resolve issues with nanometer designs.

Examples of electronic circuit simulators include the Simulation Program with Integrated Circuit Emphasis (SPICE) developed at the University of California, Berkeley (UC Berkeley), and various enhanced versions or derivatives of SPICE. SPICE and its derivatives or enhanced versions will be referred to hereafter as SPICE circuit simulators, or SPICE. The SPICE method considers a circuit as a non-divided object.

SPICE-like simulations may provide fairly accurate predictions of how corresponding circuits will behave when actually built. The predictions are preferably made not only for individual sub-circuit but also for whole systems (e.g., whole integrated circuits) so that system-wide problems relating to noise and the like may be uncovered and dealt with. In a general process flow of a SPICE-like simulation, an analog integrated circuit under simulation is often represented in the form of a netlist description. A netlist is a circuit description of the analog circuit to be simulated written in a SPICE-like language. SPICE netlists are pure structural languages with simulation control statements. Other language like Verilog-A™ has the capability to include behavioral constructs. The structural netlist of SPICE together with a predefined set of circuit components of the analog integrated circuit may be represented in the form of a matrix in accordance with certain circuit modeling methodologies (which is not a concern of the present disclosure). The number of non-linear differential equations ranges from 1 to n. There are a corresponding number of input vectors to be operated by the linear equation. The set of input vectors are shown as $\{I_1, I_2, \ldots I_n\}$. Next, the linear matrix is computed with the set of input vectors to generate a set of solution vectors $\{V_1, V_2, \ldots V_n\}$. The computation is repeated until the set of solutions converge. The set of solutions may be then displayed in the form of waveforms, measurements, or checks on a computer screen for engineers to inspect the simulation results.

However, SPICE-like simulation of a whole system becomes more difficult and problematic as the industry continues its relentless trek of scaling down to smaller and smaller device geometries and of cramming more interconnected components into the system. An example of such down scaling is the recent shift from micron-sized channels toward deep submicron sized transistor channel lengths. Because of the smaller device geometries, a circuit designer are able to cram exponentially larger numbers of circuit components (e.g., transistors, diodes, capacitors) into a given integrated circuit (IC), and therefore increases the matrix size to a complexity which may not be solved in a desired time frame.

A circuit may be represented as a large numerically discrete nonlinear matrix for analyzing instant current. The matrix dimension is of the same order as the number of the nodes in the circuit. For transient analysis, this giant non-linear system needs to solve hundreds of thousand times, thus restricting the capacity and performance of the SPICE method. The SPICE method in general can simulate a circuit up to about 50,000 nodes. Therefore it is not practical to use the SPICE method in full chip design. It is widely used in cell design, library building, and accuracy verification.

With some accuracy lost, the Fast SPICE method developed in the early 1990s provides capacity and speed about two orders of magnitude greater than the SPICE method. The performance gain was made by employing simplified models, circuit partition methods, and event-driven algorithms, and by taking advantage of circuit latency.

SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j$ (j=1, ..., n) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

For circuit simulation, computing resources are allocated for model evaluation, load model, and solve model, which can be very time consuming when the matrix size become very large for a nanometer design, as the computational cost is in the order of $n^3$, where n is the size of the matrix. Conventional applications may not have effectively use such computing resources by taking into consideration changes of the simulation environment resulting in parts of the circuit may be in bypass region during simulation, and certain processing steps may be bypassed for some parts of the matrix.

Therefore, there is a need for methods and systems that address the issues of the conventional simulation systems described above. Specifically, there is a need for methods and systems that can address region based device bypass in circuit simulation.

SUMMARY

Method and system are disclosed for naming methodologies for a hierarchical system. In one embodiment, a computer implemented method of performing region based device bypass in circuit simulation includes receiving a subcircuit for simulation, where the subcircuit includes a plurality of devices, and determining node tolerance of the plurality of devices. The computer implemented method further comprises for each device in the plurality of devices, determining whether the device has entered into a bypass region using the node tolerance of the plurality of devices, performing model evaluation in response to the device has not entered the bypass region, and skipping model evaluation in response to the device has entered the bypass region.

In another embodiment, an apparatus configured to perform region based device bypass in circuit simulation comprises one or more processors and a region based device bypass module controlled by the one or more processors. The region based device bypass module comprises logic configured to receive a subcircuit for simulation, where the subcircuit includes a plurality of devices, logic configured to determine node tolerance of the plurality of devices, and for each device in the plurality of devices, logic configured to determine whether the device has entered into a bypass region using the node tolerance of the plurality of devices, logic configured to perform model evaluation in response to the device has not entered the bypass region, and logic configured to skip model evaluation in response to the device has entered the bypass region.

In yet another embodiment, a system for performing region based device bypass in circuit simulation comprises means for receiving a subcircuit for simulation, where the subcircuit includes a plurality of devices, means for determining node tolerance of the plurality of devices; and for each device in the plurality of devices, means for determining whether the device has entered into a bypass region using the node tolerance of the plurality of devices, means for performing model evaluation in response to the device has not entered the bypass region, and means for skipping model evaluation in response to the device has entered the bypass region.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

FIG. 5A illustrates a method of determining node tolerance of FIG. 4 according to some aspects of the present disclosure.

FIG. 5B illustrates an example of examining regional sensitivity of FIG. 5A according to some aspects of the present disclosure.

FIG. 5C illustrates another example of examining regional sensitivity of FIG. 5A according to some aspects of the present disclosure.

FIG. 6A illustrates an exemplary implementation of determining whether a device has entered a bypass region of FIG. 4 according to some aspects of the present disclosure.

FIG. 6B illustrates another exemplary implementation of determining whether a device has entered a bypass region of FIG. 4 according to some aspects of the present disclosure.

FIG. 7A illustrates a method of determining conductance of a subcircuit under simulation according to some aspects of the present disclosure. FIG. 7B illustrates another representation of the method of FIG. 7A according to some aspects of the present disclosure.

Like numbers are used throughout the specification.

DESCRIPTION OF EMBODIMENTS

Methods and systems for performing region based device bypass in circuit simulation are provided. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
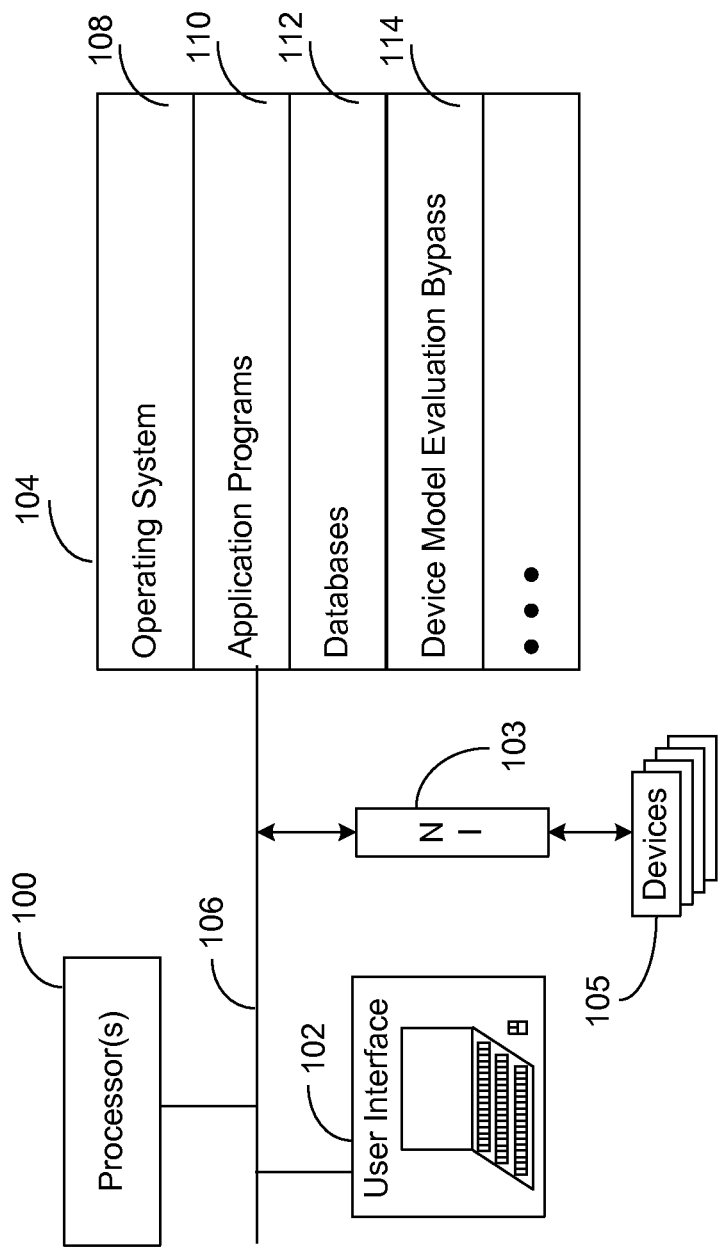
FIG. 1 illustrates a system for implementing methods of performing region based device bypass in circuit simulation according to some aspects of the present disclosure.

FIG. 1 illustrates a system for implementing methods of performing region based device bypass in circuit simulation according to an embodiment of the present disclosure. In one embodiment, the methods for performing region based device bypass in circuit simulation may be implemented using a computer system. The computer system may include one or more graphics processing units (GPUs) and/or central processing units (CPUs) 100 (hereinafter referred to as processor(s) for short), at least a user interface 102 for displaying computation results and waveforms, a memory device 104, a system bus 106, and one or more bus interfaces for connecting the GPUs/CPUs, user interface, memory device, and system bus together. The computer system also includes at least one network interface 103 for communicating with other devices 105 on a computer network. In alternative embodiments, certain functionalities of the method and system may be implemented in one or more application-specific integrated circuits (ASICs) or field-programmable gate arrays (FPGAs), thereby reducing the role of the GPU/CPU.

The memory device 104 may include high-speed random-access memory and may also include non-volatile memory, such as one or more magnetic disk storage devices. The memory device may also include mass storage that is located remotely from the GPUs/CPUs. The memory device preferably stores:

- an operating system 108 that includes procedures for handling various basic system services and for performing hardware-dependent tasks;
- application programs 110 for performing other user-defined applications and tasks, such as circuit simulations and device evaluations;
- databases 112 for storing information of the integrated circuit, the databases include data structures, device models, and matrices;
- device model evaluation bypass module 114 configured to improve efficiencies of circuit simulations.

The databases, the application programs, and the program for implementing methods of region based device bypass in circuit simulation may include executable procedures, sub-modules, tables, and other data structures. In other embodiments, additional or different modules and data structures may be used, and some of the modules and/or data structures listed above may not be used.

Figure 2:
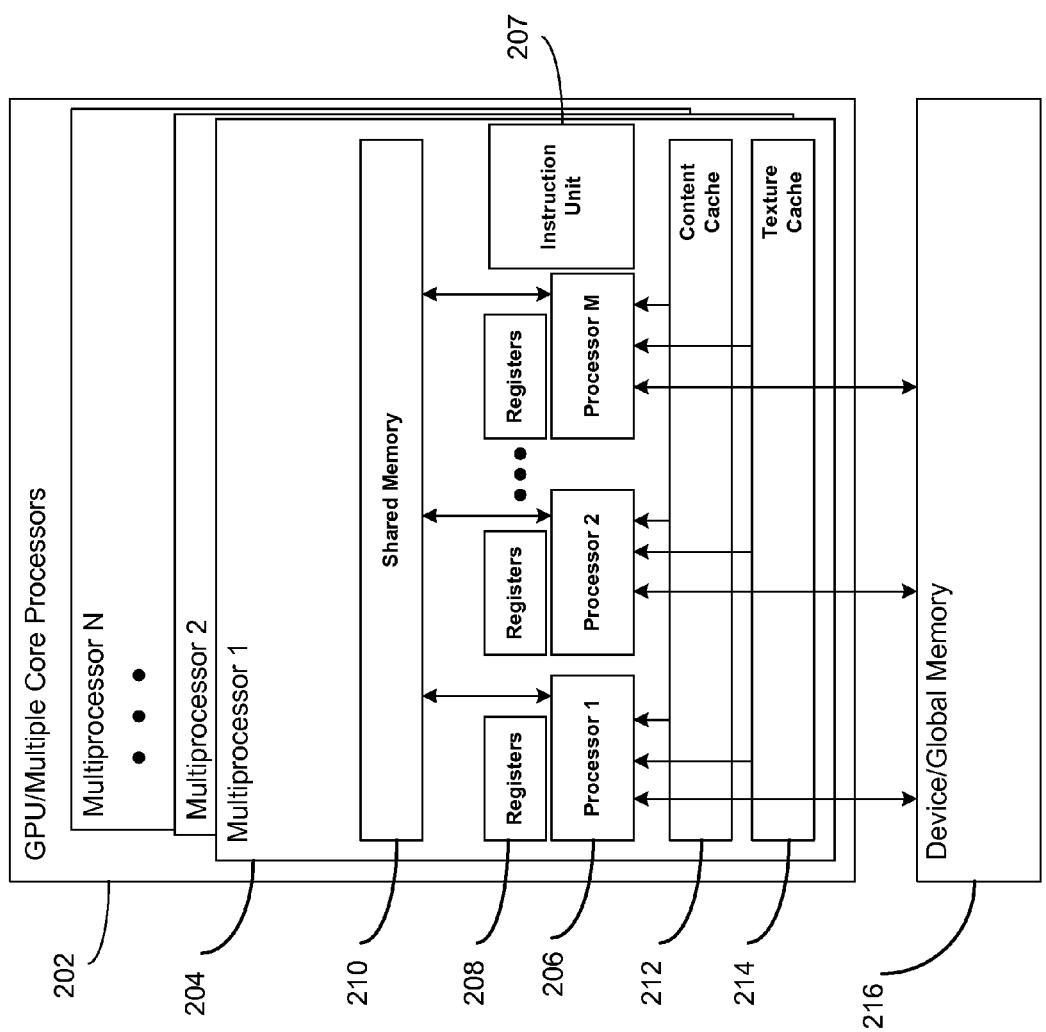
FIG. 2 illustrates an exemplary multiple core processors configured to perform region based device bypass in circuit simulation according to some aspects of the present disclosure.

FIG. 2 illustrates an exemplary multiple core processors configured to perform region based device bypass in circuit simulation according to some aspects of the present disclosure. As shown in FIG. 2, each GPU includes N multiprocessors. Each multiprocessor 204 further includes M processors 206 and an instruction unit 207. Each processor has its own registers 208. All the processors 206 in one multiprocessor 204 share a block of shared memory 210. All the processors share the same set of constant cache 212 and texture cache 214 memories. They can also access the data in device memory 216, which is also referred to as the global memory.

In this example, each multiprocessor 204 has a block of shared memory. Accessing data from the shared memory 210 is much faster than accessing data from the device (global) memory 216. For this reason, one approach to increase computational efficiency is to load the data from the global memory 216 to the shared memory 210, perform much of the computations/manipulations using the shared memory 210, and then write back the results from the shared memory 210 to the global memory 216.

Figure 3:
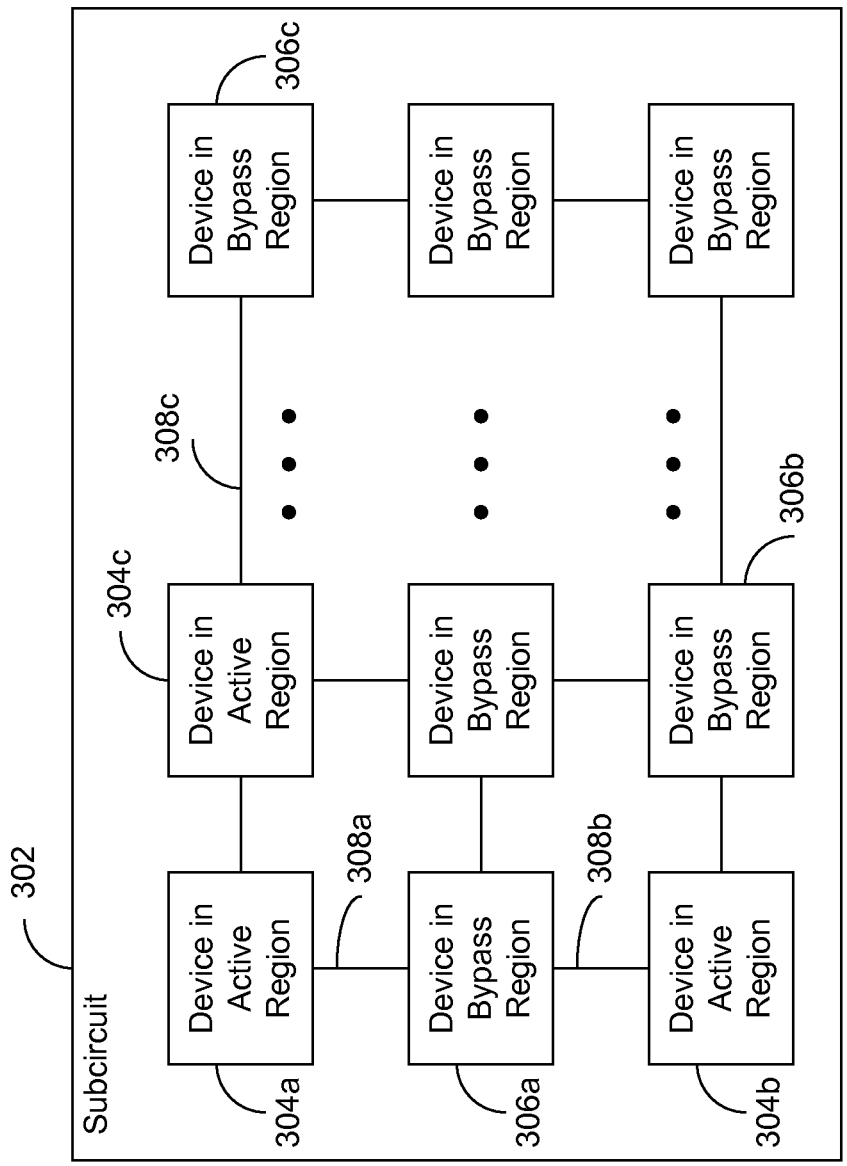
FIG. 3 illustrates an exemplary block diagram of a subcircuit under simulation according to some aspects of the present disclosure.

FIG. 3 illustrates an exemplary block diagram of a subcircuit under simulation according to some aspects of the present disclosure. As shown in FIG. 3, subcircuit 302 may include multiple devices. During simulation, some of the devices may be active, shown as device in active region such as 304a, 304b, and 304c, etc. Some other devices may be inactive, shown as device in bypass region such as 306a, 306b, and 306c, etc. The multiple devices may be connected (or coupled) to each other, represented by links 308a, 308b, 308c, etc. Methods for determining whether a device may be inactive (in bypass region) are described below in association with FIG. 5A.

Figure 4:
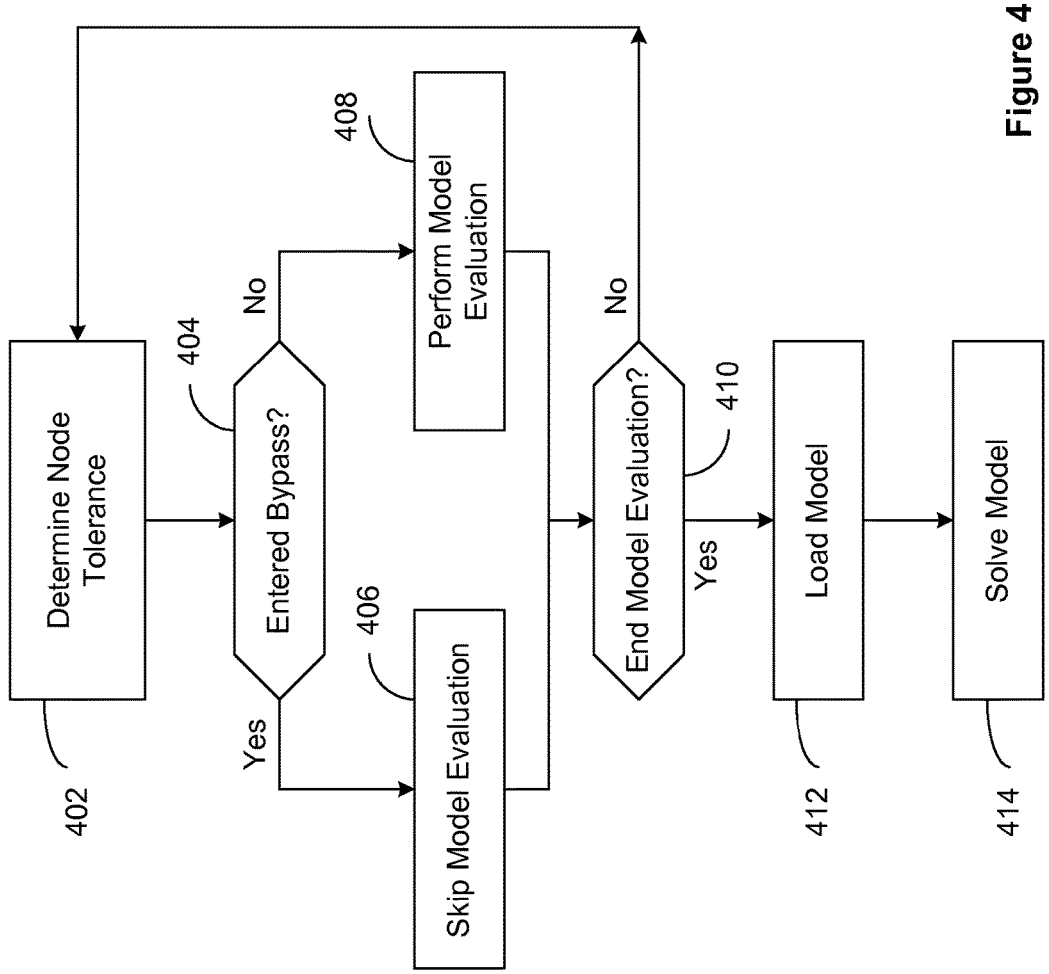
FIG. 4 illustrates a method of performing region based device bypass in circuit simulation according to some aspects of the present disclosure.

FIG. 4 illustrates a method of performing region based device bypass in circuit simulation according to some aspects of the present disclosure. In the example shown in FIG. 4, in block 402, according to aspects of the present disclosure, various factors may be considered to determine whether a device has entered the bypass region. For example, the method may examine variations of node voltages, regional sensitivity, contextual sensitivity, and functional sensitivity of the device in view of the node tolerance as described in association with FIG. 5A.

In block 404, for each device in the subcircuit 302, the method determines whether the device has entered a bypass region. If the device has entered the bypass region (404_Yes), the method moves to block 406. Alternatively, if the device has not entered the bypass region, the method moves to block 408.

In block 406, the method skips model evaluation for the device that has entered the bypass region. In block 408, the method performs model evaluation for the device that has not entered bypass region. In block 410, the method determines whether to end model evaluation. If all the devices in the subcircuit 302 have been processed (410_Yes), the method moves to block 412. Otherwise, if there are more devices to be processed (410_No), the method moves back to block 402 and repeats the blocks 402 to 410 until all devices in the subcircuit 302 have been processed.

In block 412, the method loads the device models. According to aspects of the present disclosure, for devices that are in bypass region, their corresponding changes of conductance (g') and changes of capacitance (c') may be deemed to be substantially minimal and such values of conductance (g') and capacitance (c') may be preloaded as described in association with FIGS. 7A-7B and FIGS. 8A-8B. For devices that are not in bypass region (i.e. in active region), their corresponding conductance (g) and capacitance (c) may be loaded to a conductance matrix G and a capacitance matrix C using scatter-gather operations as described in association with FIGS. 7A-7B and FIGS. 8A-8B. In block 414, the method performs solving using the device models created in block 412.

FIG. 5A illustrates a method of determining node tolerance of FIG. 4 according to some aspects of the present disclosure. As shown in FIG. 5A, in block 502, the method may examine variations of each node voltage with respect to its corresponding predetermined node tolerance (for example 1 mV, 2 mV, etc.) for the multiple devices in the subcircuit 302 under simulation. In some implementations, if the variation at a node exceeds its predetermined node tolerance, the device may be deemed to have entered bypass.

In block 504, the method may examine the device in accordance with sensitivity in different operating regions of the device. For example, the predetermined node tolerance may be adjusted based on whether the device is in the cutoff region, linear region, or saturation region. In some implementations, different predetermined node tolerance may be used in the different operating regions.

In block 506, the method may examine the device in context of its one or more neighboring devices to determine the predetermined node tolerance for the device. For example, the method may examine the context of the one or more neighboring devices based on sizes of the one or more neighboring devices compared to the device. In other implementations, the method may examine the device based on the aggregated conductance of the one or more neighboring devices compared to the device. In yet other implementations the method may examine the aggregated capacitance of the one or more neighboring devices compared to the device.

In block 508, the method may examine functional sensitive of the device with respect to functions of one or more neighboring devices in determining the predetermined node tolerance of the device. For example, if the device is an inverter, its predetermined node tolerance can be very different than the situation if the device is an amplifier. For another example, if the device is an adder, its predetermined node tolerance can be very different than the situation if the device is an oscillator.

FIG. 5B illustrates an example of examining regional sensitivity of FIG. 5A according to some aspects of the present disclosure. In the example of FIG. 5B, drain current ($I_{ds}$) versus drain-to-source voltage ($V_{ds}$) for several values of $V_{gs}$-$V_{th}$ of a metal-oxide-semiconductor field-effect transistor (MOSFET) is shown. The horizontal axis represents the drain-to-source voltage ($V_{ds}$) and the vertical axis represents the drain current ($I_{ds}$). For a given gate voltage, $I_{ds}$ increases linearly with $V_{ds}$, and then it gradually levels off, approaching a saturated value. The linear region of the MOSFET is represented by numeral 510 and the saturation region of the MOSFET is represented by numeral 512. According to aspects of the present disclosure, the sensitivity of the MOSFET may be examined according to the different operating regions of the MOSFET. For example, the node tolerance may be adjusted based on whether the device is in the linear region 510, or saturation region 512. In addition, different node tolerances may be used in the different operating regions.

FIG. 5C illustrates another example of examining regional sensitivity of FIG. 5A according to some aspects of the present disclosure. In the example of FIG. 5C, drain current ($I_{ds}$) versus gate-to-source voltage ($V_{gs}$) for a MOSFET is shown. The horizontal axis represents the gate-to-source voltage ($V_{gs}$) and the vertical axis represents the drain current ($I_{ds}$). In this example, $I_{ds}$ increases linearly with $V_{gs}$, and then it gradually levels off. The saturation region of the MOSFET is represented by numeral 514. According to aspects of the present disclosure, the sensitivity of the MOSFET may be examined according to the different operating regions of the device. For example, the node tolerance may be adjusted based on whether the device is in the saturation region 514. In addition, a predetermined node tolerance may be used in the saturation region 514.

FIG. 6A illustrates an exemplary implementation of determining whether a device has entered a bypass region of FIG. 4 according to some aspects of the present disclosure. In block 602, the method determines whether the device has entered the bypass region for temporarily using the method of determination described in FIG. 5A. In some situations, a device may enter the bypass regions temporarily and then becomes active again. The method may keep track of the event that the device has been in bypass region for a predetermined number of cycles, which may be a programmable parameter. While the device in the bypass region may still be within the predetermined number of cycles, the device may be deemed to have entered temporary bypass. If the device has entered temporary bypass (602_Yes), the method moves to block 604. Alternatively, if the device has not entered temporary bypass (602_No), the method moves to block 408.

In block 604, the method determines whether the device has entered the bypass region for an extended period of time using the method of determination described in FIG. 5A. As described above, method may keep track of the event that the device has been in bypass region for a predetermined number of cycles. After the device has stayed in the bypass region exceeds the predetermined number of cycles, then the device may be deemed to have entered extended bypass. If the device has entered extended bypass (604_Yes), the method moves to block 406. Alternatively, if the device has not entered extended bypass (604_No), the method moves to block 408. In other words, in this exemplary implementation, the model evaluation may be skipped only if the device has entered extended bypass; otherwise, model evaluation can be performed for the device.

FIG. 6B illustrates another exemplary implementation of determining whether a device has entered a bypass region of FIG. 4 according to some aspects of the present disclosure. In the exemplary implementation shown in FIG. 6B, the method of determining whether a device has entered temporary bypass (block 602) and the method of determining whether a device has entered extended bypass (block 604) can be similar to the methods described in association with FIG. 6A. In block 602, if the device has entered temporary bypass (602_Yes), the method moves to block 406. Alternatively, if the device has not entered temporary bypass (602_No), the method moves to block 604. In block 604, if the device has entered extended bypass (604_Yes), the method moves to block 406. Alternatively, if the device has not entered extended bypass (604_No), the method moves to block 408. In this exemplary implementation, model evaluation may be skipped if the device has entered temporary bypass or the device has entered extended bypass. Otherwise, model evaluation can be performed for the device.

FIG. 7A illustrates a method of determining conductance of a subcircuit under simulation according to some aspects of the present disclosure. As shown in FIG. 7A, conductance of the device(s) in bypassed region may be represented by g' (in block 702); conductance of the device(s) in temporary bypassed region may be represented by g" (in block 703); and conductance of the device(s) in active region may be represented by g (in block 704). For each time step of the simulation, the total conductance of the subcircuit under simulation, represented by G (in block 706), can be a combination of the conductance of the device(s) in bypassed region (g'), the conductance of the device(s) in temporary bypassed region (g"), and the conductance of the device(s) in active region (g).

FIG. 7B illustrates another representation of the method of FIG. 7A according to some aspects of the present disclosure. In the exemplary implementation shown in FIG. 7B, when a device enters the bypass region, the method may preload the conductance of the device (g') in a bypass aggregation conductance matrix (G') 708. In other words, contributions of conductance from devices in the subcircuit that are in the bypass region are pre-summed and stored in the bypass aggregation conductance matrix (G') 708. On the other hand, when the devices leave the bypass region, their contributions of conductance may be subtracted from the bypass aggregation conductance matrix (G') 708. According to aspects of the present disclosure, the bypass aggregation conductance matrix (G') 708 may have the same format as the conductance matrix G. In other implementations, the bypass aggregation conductance matrix (G') may be implemented as a sequential array. At each time step of the simulation, the contents of the bypass aggregated conductance matrix (G') 708 may be added to the conductance matrix (G) 706. According to aspects of the present disclosure, conductance of device(s) in temporary bypass region (g") (block 703), and conductance of device(s) in active region (g) (block 704) may be accounted in the conductance matrix G 706 through scatter/gather operations.

According to aspects of the present disclosure, bypass status at the beginning of time step iteration may be checked as follows:
1) Compare inactive device terminals relative voltage (VDS, VGS, VBS) with last step.
   a) The comparison tolerance setting is obtained from device by different regions.
2) If any dimension of voltage is beyond tolerance, then leave bypass state and activate the device:
   a) Recover inactive matrix by reduce the contribution (device local matrix) of the activated device;
   b) Recover RHS by reduce delta RHS (=originalRHS when entering bypass+device local matrix*(current iteration solution−solution of entering bypass)).
3) If all dimension of voltage are within tolerance, stay bypass
   a) Adjust RHS by extrapolation (delta RHS=device local matrix*(current iteration solution−past iteration solution)).

According to aspects of the present disclosure, bypass status at the finish stage of time step iteration may be checked as follows:
1) Compare ACTIVE device terminals relative voltage (VDS, VGS, VBS) with last step.
   a) The comparison tolerance setting is obtained from device by different regions.
2) If any dimension of voltage is beyond tolerance, stay non-bypass;
3) If all dimension of voltage are within tolerance, enter bypass:
   a) Stamp device local matrix to global inactive matrix;
   b) Stamp device terminal RHS to global inactive RHS;
   c) Store the terminal voltage of device and local matrix/RHS of this device in device for future reference.

Figure 8A:
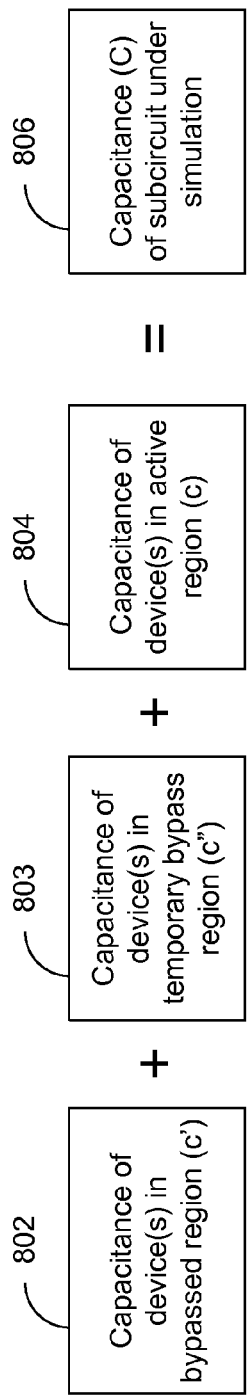
FIG. 8A illustrates a method of determining capacitance of a subcircuit under simulation according to some aspects of the present disclosure.

FIG. 8A illustrates a method of determining capacitance of a subcircuit under simulation according to some aspects of the present disclosure. Similar to the method shown in FIG. 7A with respect to the conductance of the subcircuit, capacitance of the device(s) in bypassed region may be represented by c' (in block 802); capacitance of the device(s) in temporary bypassed region may be represented by c" (in block 803); and capacitance of the device(s) in active region may be represented by c (in block 804). For each time step of the simulation, the total capacitance of the subcircuit under simulation, represented by C (in block 806), can be a combination of the capacitance of the device(s) in bypassed region (c'), the capacitance of the device(s) in temporary bypassed region (c"), and the capacitance of the device(s) in active region (c).

Figure 8B:
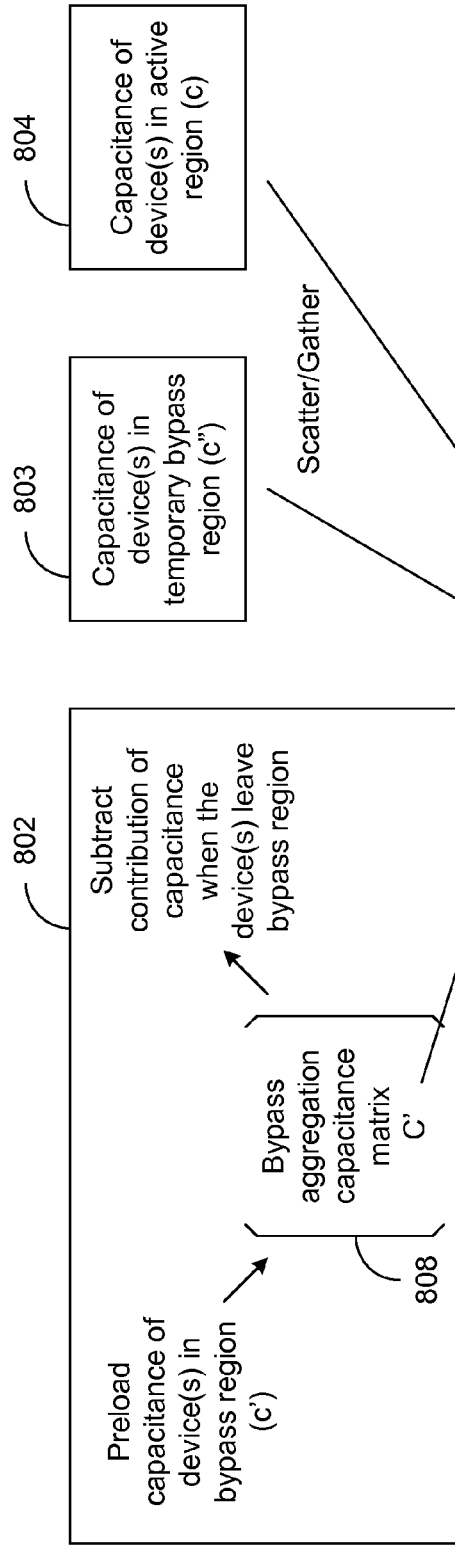
FIG. 8B illustrates another representation of the method of FIG. 8A according to some aspects of the present disclosure.

FIG. 8B illustrates another representation of the method of FIG. 8A according to some aspects of the present disclosure. Similar to the method shown in FIG. 7B with respect to the conductance of the subcircuit, when a device enters the bypass region, the method may preload the capacitance of the device (c') in a bypass aggregation capacitance matrix (C') 808. In other words, contributions of capacitance from devices in the subcircuit that are in the bypass region may be pre-summed and stored in the bypass aggregation capacitance matrix (C') 808. On the other hand, when the devices leave the bypass region, their contributions of capacitance may be subtracted from the bypass aggregation capacitance matrix (C') 808. According to aspects of the present disclosure, the bypass aggregation capacitance matrix (C') 808 may have the same format as the capacitance matrix C. In other implementations, the bypass aggregation capacitance matrix (C') may be implemented as a sequential array. At each time step of the simulation, the contents of the bypass aggregated capacitance matrix (C') 808 may be added to the capacitance matrix (C) 806. According to aspects of the present disclosure, capacitance of device(s) in temporary bypass region (c") (block 803) and capacitance of device(s) in active region (c) (block 804) may be accounted in the capacitance matrix C 806 through scatter/gather operations.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

We claim:

1. A computer implemented method of performing region based device bypass in circuit simulation, comprising:
   receiving a subcircuit for simulation, wherein the subcircuit includes a plurality of devices;
   determining node tolerance of the plurality of devices, including examining variations of each node voltage with respect to a corresponding predetermined node tolerance;
   for each device in the plurality of devices,
   determining whether the device has entered into a bypass region using the node tolerance of the plurality of devices;
   performing model evaluation in response to the device has not entered the bypass region;
   skipping model evaluation in response to the device has entered the bypass region, comprising preloading conductance of the device its a bypass aggregation conductance matrix, and adding the bypass aggregation conductance matrix to a conductance matrix of the subcircuit at each time step, wherein a sum of the bypass aggregation conductance matrix and the conductance matrix is used to reduce computation in a model evaluation process of the circuit simulation.

2. The computer implemented method of claim 1, further comprising:
   loading a model of the subcircuit; and
   solving the model of the subcircuit.

3. The computer implemented method of claim 1, wherein the determining node tolerance for the plurality of devices comprises:
   examining the device in accordance with sensitivity in different operating regions, wherein the different operating regions comprises at least one cutoff region, linear region, and saturation region; and
   applying different tolerance criteria based on the different operating regions.

4. The computer implemented method of claim 1, wherein the determining node tolerance for the plurality of devices further comprises:
   examining the device to context of one or more neighboring devices, wherein the context of the one or more neighboring devices comprises physical characteristics of the one or more neighboring devices.

5. The computer implemented method of claim 4, wherein the physical characteristics of the one or more neighboring devices comprises at least one of:
   geometry of the one or more neighboring devices compared to the device;
   drive current of the one or more neighboring devices compared to the device;
   leakage current of the one or more neighboring devices compared to the device;
   active power of the one or more neighboring devices compared to the device;
   electron mobility of the one or more neighboring devices compared to the device;
   hole mobility of the one or more neighboring devices compared to the device;
   threshold voltages of the one or more neighboring devices compared to the device;
   aggregated conductance of the one or more neighboring devices compared to the device; and
   aggregated capacitance of the one or more neighboring devices compared to the device.

6. The computer implemented method of claim 1, wherein the determining node tolerance for the plurality of devices further comprises:
   examining functional sensitive of the device with respect to role of the device in circuit level functions of the one or more neighboring devices.

7. The computer implemented method of claim 1, wherein determining whether the device being in a bypass region comprises:
   determining whether the device has entered the bypass region for a temporary period of time; and
   determining whether the device has entered the bypass region for an extended period of time.

8. The computer implemented method of claim 7, further comprises at least one of:
   identifying the device being in bypass region in response to the device has entered the bypass region for the temporary period of time; and
   identifying the device being in bypass region in response to the device has entered the bypass region for the extended period of time.

9. The computer implemented method of claim 1, wherein the performing model evaluation in response to device has not entered the bypass region comprises:
   performing a gathering operation to update a conductance matrix of the subcircuit using conductance of the device.

10. The computer implemented method of claim 1, wherein the performing model evaluation in response to the device has not entered the bypass region further comprises:
    performing a gathering operation to update a capacitance matrix of the subcircuit using capacitance of the device.

11. A computer implemented method of performing region based device bypass in circuit simulation, comprising:
    receiving a subcircuit for simulation, wherein the subcircuit includes a plurality of devices;

determining node tolerance of the plurality of devices, including examining variations of each node voltage with respect to a corresponding predetermined node tolerance;

for each device in the plurality of devices, determining whether the device has entered into a bypass region using the node tolerance of the plurality of devices;

performing model evaluation in response to the device has not entered the bypass region; and skipping model evaluation in response to the device has entered the bypass region, comprising preloading capacitance of the device in a bypass aggregation capacitance matrix, and adding the bypass aggregation capacitance matrix to a capacitance matrix of subcircuit at each time step, wherein a sum of the bypass aggregation capacitance matrix and the capacitance matrix is used to reduce computation in a model evaluation process of the circuit simulation.

12. An apparatus configured to perform region based device bypass in circuit simulation, comprising:

one or more processors;

a region based device bypass module controlled by the one or more processors; wherein the region based device bypass module comprises:

logic configured to receive a subcircuit for simulation, wherein the subcircuit includes a plurality of devices;

logic configured to determine node tolerance of the plurality of devices, including logic configured to examine variations of each node voltage with respect to a corresponding predetermined node tolerance;

for each device in the plurality of devices, logic configured to determine whether the device has entered into a bypass region using the node tolerance of the plurality of devices;

logic configured to perform model evaluation in response to the device has not entered the bypass region; and logic configured to skip model evaluation in response to the device has entered the bypass region, comprising logic configured to preload conductance of the device in a bypass aggregation conductance matrix, and logic configured to add the bypass aggregation conductance matrix to a conductance matrix of the subcircuit at each time step, wherein a sum of bypass aggregation conductance matrix and the conductance matrix is used to reduce computation in a model evaluation process of the circuit simulation.

13. The apparatus of claim 12, further comprising:

logic configured to load a model of the subcircuit; and
logic configured to solve the model of the subcircuit.

14. The apparatus of claim 12, wherein the logic configured to determine node tolerance for the plurality of devices comprises:

logic configured to examine the device in accordance with sensitivity in different operating regions, wherein the different operating regions comprises at least one of cutoff region, linear region, and saturation region; and
logic configured to apply different tolerance criteria based on the different operating regions.

15. The apparatus of claim 12, wherein the logic configured to determine node tolerance for the plurality of devices further comprises:

logic configured to examine the device in context of one or more neighboring devices, wherein the context of the one or more neighboring devices comprises physical characteristics of the one or more neighboring devices.

16. The apparatus of claim 15, wherein the physical characteristics of the one or more neighboring devices comprises at least one of:

geometry of the one or more neighboring devices compared to the device;
drive current of the one or more neighboring devices compared to the device;
leakage current of the one or more neighboring devices compared to the device;
active power of the one or more neighboring devices compared to the device;
electron mobility of the one or more neighboring devices compared to the device;
hole mobility of the one or more neighboring devices compared to the device;
threshold voltages of the one or more neighboring devices compared to the device;
aggregated conductance of the one or more neighboring devices compared to the device; and
aggregated capacitance of the one or more neighboring devices compared to the device.

17. The apparatus of claim 12, wherein the logic configured to determine node tolerance for the plurality of devices further comprises:

logic configured to examine functional sensitive of the device with respect to role of the device in circuit level functions of the one or more neighboring devices.

18. The apparatus of claim 12, wherein logic configured to determine whether the device being in a bypass region comprises:

logic configured to determine whether the device has entered the bypass region for a temporary period of time; and
logic configured to determine whether the device has entered the bypass region for an extended period of time.

19. The apparatus of claim 18, further comprises at least one of:

logic configured identify the device being in bypass region in response to the device has entered the bypass region for the temporary period of time; and
logic configured to identify the device being in bypass region in response to the device has entered the bypass region for the extended period of time.

20. The apparatus of claim 12, wherein the logic, configured to perform model evaluation in response to the device has not entered the bypass region comprises:

logic configured to perform a gathering operation to update a conductance matrix of the subcircuit using conductance of the device.

21. The apparatus of claim 13, wherein the logic configured to perform model evaluation in response to the device has not entered the bypass region further comprises:

logic configured to perform a gathering operation update a capacitance matrix of the subcircuit using capacitance of the device.

22. An apparatus configured to perform region based device bypass in circuit simulation, comprising:

one or more processors;
a region based device bypass module controlled by the one more processors; wherein the region based device bypass module comprises:
logic configured to receive a subcircuit for simulation, wherein the subcircuit includes a plurality of devices;
logic configured to determine node tolerance of the plurality of devices, including logic configured to examine variations of each node voltage with respect to a corresponding predetermined node tolerance;

for each device in the plurality of devices, logic configured to determine whether the device has entered into a bypass region using the node tolerance of the plurality of devices;

logic configured to perform model evaluation in response to the device has not entered the bypass region; and logic configured to skip model evaluation in response to the device has entered the bypass region, comprising configured to preload capacitance of the device in a bypass aggregation capacitance matrix, and logic configured to add the bypass aggregation capacitance matrix to a capacitance matrix of the subcircuit at each time step, wherein a sum of bypass aggregation capacitance matrix and the capacitance matrix is used to reduce computation in a model evaluation process of the circuit simulation.

* * * * *